United States Patent
Chang et al.

(10) Patent No.: US 6,336,787 B1
(45) Date of Patent: Jan. 8, 2002

(54) METHOD FOR TRANSFERRING WAFERS IN A SEMICONDUCTOR TAPE-PEELING APPARATUS

(75) Inventors: Chin-hsiang Chang, Chilung; Yun-liang Ouyang, Tamshui; Chih-shen Yang, Taipei; Kuei-chang Tsai, Ching-Shui, all of (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/551,194

(22) Filed: Apr. 17, 2000

(30) Foreign Application Priority Data

Oct. 7, 1999 (TW) .......................................... 88117464

(51) Int. Cl.⁷ .......................... A01L 21/68; B25J 15/06; C09J 7/02
(52) U.S. Cl. ........................................ 414/941; 156/584
(58) Field of Search ................................ 414/807, 810, 414/811, 816, 416.01, 416.03, 416.08, 936, 937, 941, 403, 411; 156/584

(56) References Cited

U.S. PATENT DOCUMENTS

| 5,601,732 A | * | 2/1997 | Yoshida ..................... 216/36 X |
| 6,238,515 B1 | * | 5/2001 | Tsujimoto et al. ... 156/379.8 X |

FOREIGN PATENT DOCUMENTS

| EP | 000307509 A2 | * | 2/1989 | ........... H01L/21/00 |
| JP | 401043458 A | * | 2/1989 | ........... B65H/37/04 |
| JP | 402018 456 A | * | 3/1990 | ................. 414/941 |

* cited by examiner

Primary Examiner—Christopher P. Ellis
Assistant Examiner—Kenneth W Bower
(74) Attorney, Agent, or Firm—Bacon & Thomas, PLLC

(57) ABSTRACT

A wafer transfer method using a robot arm for sucking the front-side of the uppermost one of a plurality of wafers stored in a cassette, and for transferring the wafer having a tape adhered to the front-side thereof to a semiconductor tape-peeling device for tape-peeling. Although the wafer warps, the undesired effect that the robot arm crashes any of the wafers can be avoided by using this method.

2 Claims, 7 Drawing Sheets

METHOD FOR TRANSFERRING WAFERS IN A SEMICONDUCTOR TAPE-PEELING APPARATUS

FIELD OF THE INVENTION

The present invention relates generally to a method for transferring wafers in a semiconductor tape-peeling apparatus, and more particularly, to a wafer transfer method which prevents a wafer from being broken during a wafer transfer process.

BACKGROUND OF THE INVENTION

In a semiconductor manufacturing process, a tape is generally adhered to the front-side (the surface where a wiring pattern is formed) of a wafer before carrying out back-side lapping in order to protect the wiring pattern of the wafer. Usually, the wafer is lapped to the thickness of, for example, 200 µm by back-side lapping.

Referring to FIGS. 1 and 2, a conventional semiconductor tape-peeling apparatus includes a first cassette 1, a second cassette 2, a robot arm 3, a flat positioner 6, and a tape-peeling device 5. A suction means 7 is provided on the robot arm 3 to clamp and transfer a wafer 4 to be processed in the tape-peeling step.

Referring to FIGS. 2 and 3, the first cassette 1 includes twenty five wafer storage slots S01 to S25 (slots S06 to S25 are not shown). The wafers W01 to W25 (wafers W06 to W25 are not shown) are stored in the wafer storage slots S01 to S25 respectively of the first cassette 1. A tape (not shown) is adhered to the front-side of each of the wafers W01 to W25 that have been processed by back-side lapping. The thickness of each of the wafers W01 to W25 is about 200 µm. It should be noted that the dimensions of these parts are not on the same scale, and the relationship among these parts is only shown schematically.

The operation method of the semiconductor tape-peeling apparatus are described hereinbelow. It should be noted that 25 wafers W01 to W25 are stored in the first cassette 1, but no wafer is stored in the second cassette 2 having the same construction as the first cassette 1. The second cassette 2 also includes 25 wafer storage slots S01 to S25 (not shown). Referring to FIGS. 2 and 3, the operation method includes the steps of:

(1) moving the robot arm 3 to the first cassette 1 so that the suction means 7 enters the first cassette 1;

(2) sucking the back-side of the wafer Wi(i=01 to 25) by the suction means 7 (it should be noted that the wafer Wi corresponds to the wafer 4 in FIG. 2 at this moment);

(3) activating the robot arm 3 to unload the wafer Wi from the first cassette 1;

(4) transferring the wafer Wi to the flat positioner 6;

(5) positioning the wafer Wi by the flat positioner 6 so that the flat side or notch of the wafer Wi directs to a predetermined direction;

(6) activating the robot arm 3 to suck the back-side of the wafer Wi by the suction means 7;

(7) transferring the wafer Wi to the tape-peeling device 5;

(8) peeling the tape on the wafer Wi by the tape-peeling device 5;

(9) activating the robot arm 3 to suck the back-side of the wafer Wi by the suction means 7;

(10) transferring the wafer Wi to the second cassette 2;

(11) storing the wafer Wi to the wafer storage slot Si(i=01 to 25) of the second cassette 2; and

(12) repeating steps (1) to (11) until the tapes on the wafers W01 to W25 are peeled and the wafers W01 to W25 are stored in the wafer storage slots S01 to S25 respectively.

Under the idealized condition, i.e., the condition in which the wafer 4 does not warp, each of the wafers W01 to W25 are stored in each of the wafer storage slots S01 to S25 as shown in FIG. 3. The positions of the suction means 7 where the suction means 7 sucks the wafers W01 to W25 are illustrated in FIG. 3.

Under the actual condition, when the tapes are adhered to the front-side of the wafers W01 to W25, the tapes are in a tensile mode. Therefore, the tapes adhered to the front-sides of the wafers W01 to W25 are capable of warping the center portions of the wafers W01 to W25 downwardly.

Furthermore, because each of the lapped wafers W01 to W25 is so thin that the strength thereof is not enough to resist the tensile force of the tape, and owing to the effect of the high temperature in the manufacturing process, each of the wafers W01 to W25 tends to warp easily, as shown in FIG. 4. As a result, when entering the first cassette 1, the wafers W01 to W25 can be crashed by the suction means 7.

In order to prevent the suction means 7 from crashing any of the wafers W01 to W25, a method for repositioning the suction means 7 is adopted, as shown in FIG. 5. According to this method, the position of the suction means 7 is adjusted to avoid crashing the wafers W01 to W25. However, because the warpage degrees of the wafers W01 to W25 are not uniform, the wafers W01 to W25 can still be crashed by the suction means 7, as shown in FIG. 6.

Referring to FIG. 7, vacuuming conduits 71 are formed on two sides of the suction means 7. The wafer W01 is sucked downwardly by the vacuuming conduits 71. The deformation of the wafer W01 becomes large, and the wafer W01 can be damaged.

Thus, the above problem cannot be completely solved using the method for repositioning the suction means 7. Furthermore, an unexpected damage can be caused when using the method for sucking the back-side of the wafer.

SUMMARY OF THE INVENTION

It is therefore an object of the present invention to provide a wafer transfer method for use with a semiconductor tape-peeling apparatus so as to prevent the robot arm from crashing the wafer.

In accordance with the first aspect of the invention, a method for transferring wafers in a semiconductor tape-peeling apparatus is provided. The semiconductor tape-peeling apparatus comprises: a first cassette for storing a plurality of wafers, each of the wafers having a front-side to which a tape is adhered and a back-side; and a robot arm including a suction means for sucking and transferring the wafers, the wafer transfer method comprises the step of:

sucking the front side of the uppermost one of the wafers stored in the first cassette and unloading the wafer.

According to the above wafer transfer method, the undesired result that the warped wafers stored in the cassette are crashed by the robot arm can be avoided.

The semiconductor tape-peeling apparatus further comprises a flat positioner, a tape-peeling device, and a second cassette, the wafer transfer method further comprises the steps of: transferring the wafer to the flat positioner; positioning the wafer by the flat positioner; sucking the back-side of the wafer by the robot arm; transferring the wafer to the tape-peeling device; peeling the tape on the wafer by the tape-peeling device; sucking the back-side of the wafer; and transferring the wafer to the second cassette.

BRIEF DESCRIPTION OF THE DRAWINGS

The above and other objects and the features of the present invention can be best understood by referring to the following detailed description of a preferred embodiment and the accompanying drawings, wherein.

DETAILED DESCRIPTION OF THE PREFERRED EMBODIMENT

Figure 8:
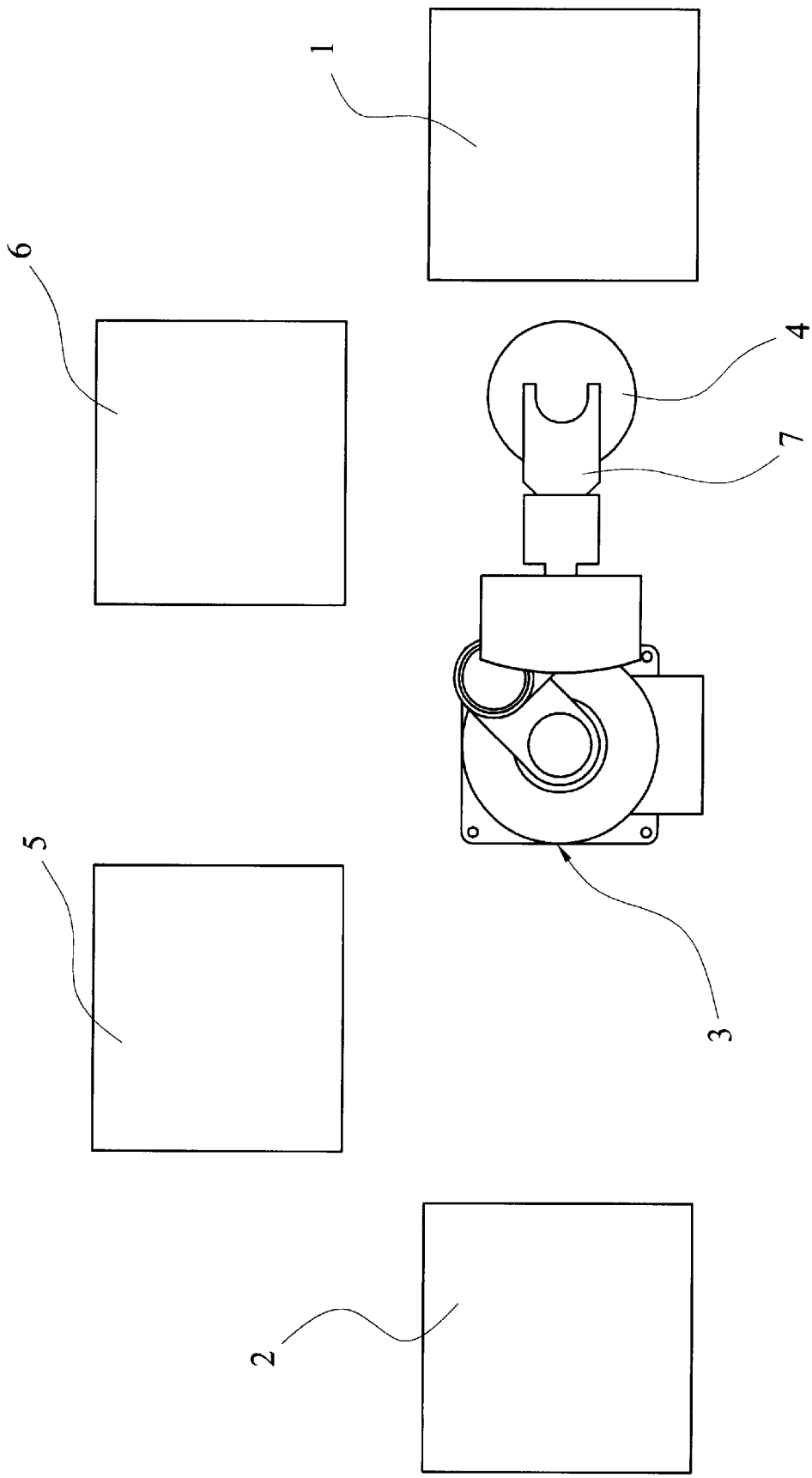
FIG. 8 is a schematic illustration showing a semiconductor tape-peeling apparatus in accordance with a preferred embodiment of the invention.
Figure 9:
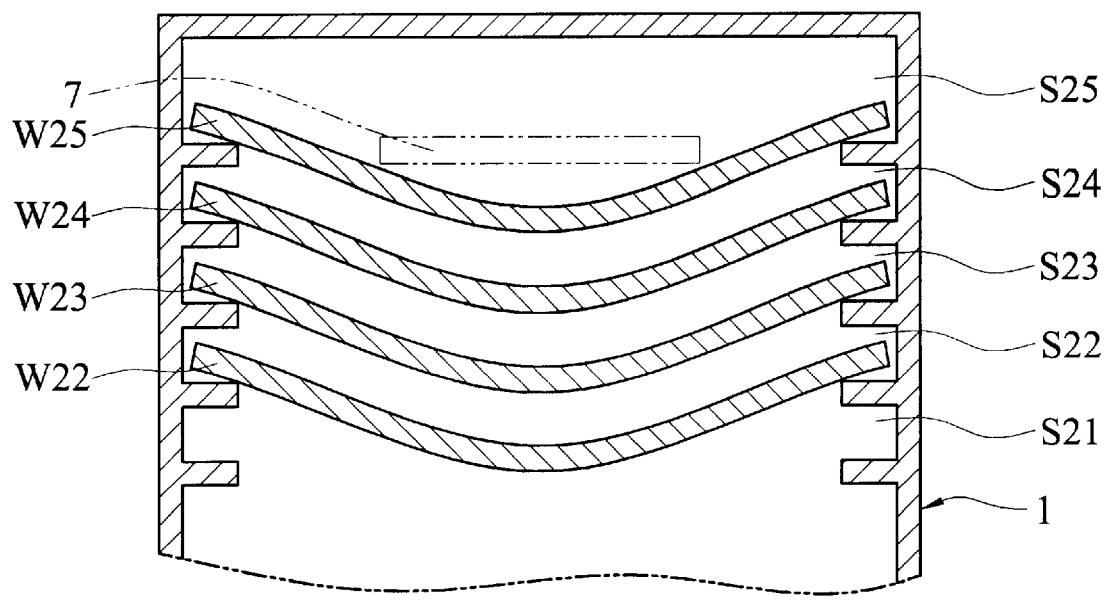
FIG. 9 is a practically partial sectional illustration showing the positions of the first cassette, the suction means, and the wafers in the semiconductor tape-peeling apparatus in accordance with the preferred embodiment of the invention.

Referring now to FIG. 8, a semiconductor tape-peeling apparatus in accordance with a preferred embodiment of the invention includes a first cassette 1, a second cassette 2, a robot arm 3, a flat positioner 6, and a tape-peeling device 5. The robot arm 3 includes a suction means 7 for sucking a wafer 4 and transfers the wafer 4 to a predetermined position for peeling. Referring to FIG. 9, both of the first cassette 1 and the second cassette 2 include 25 wafer storage slots S25 to S01 (slots S20 to S01 are not shown) for storing the wafers W25 to W01 (wafers W21 to W01 are not shown).

Figure 1:
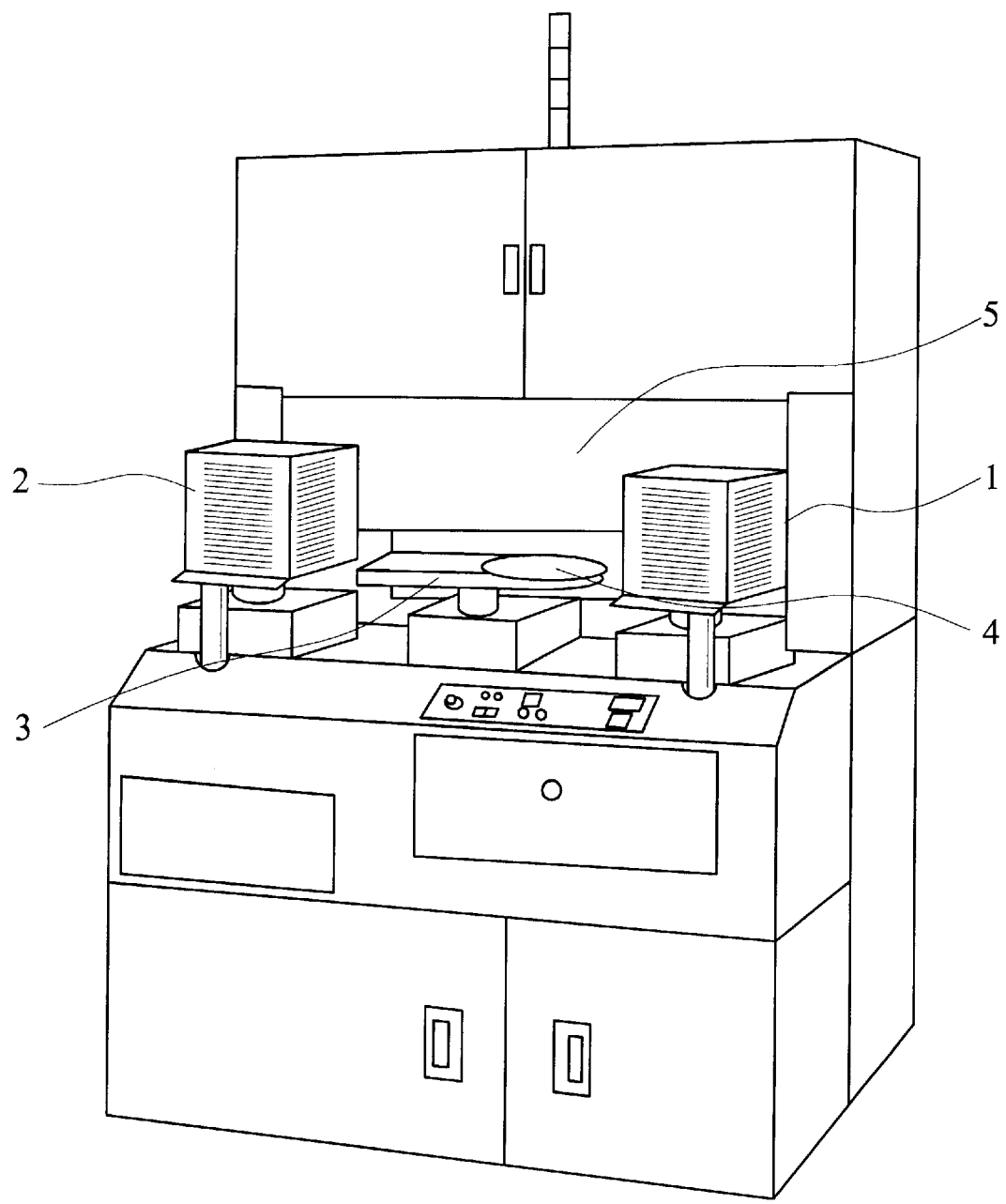
FIG. 1 is a pictorial view showing a semiconductor tape-peeling apparatus.
Figure 2:
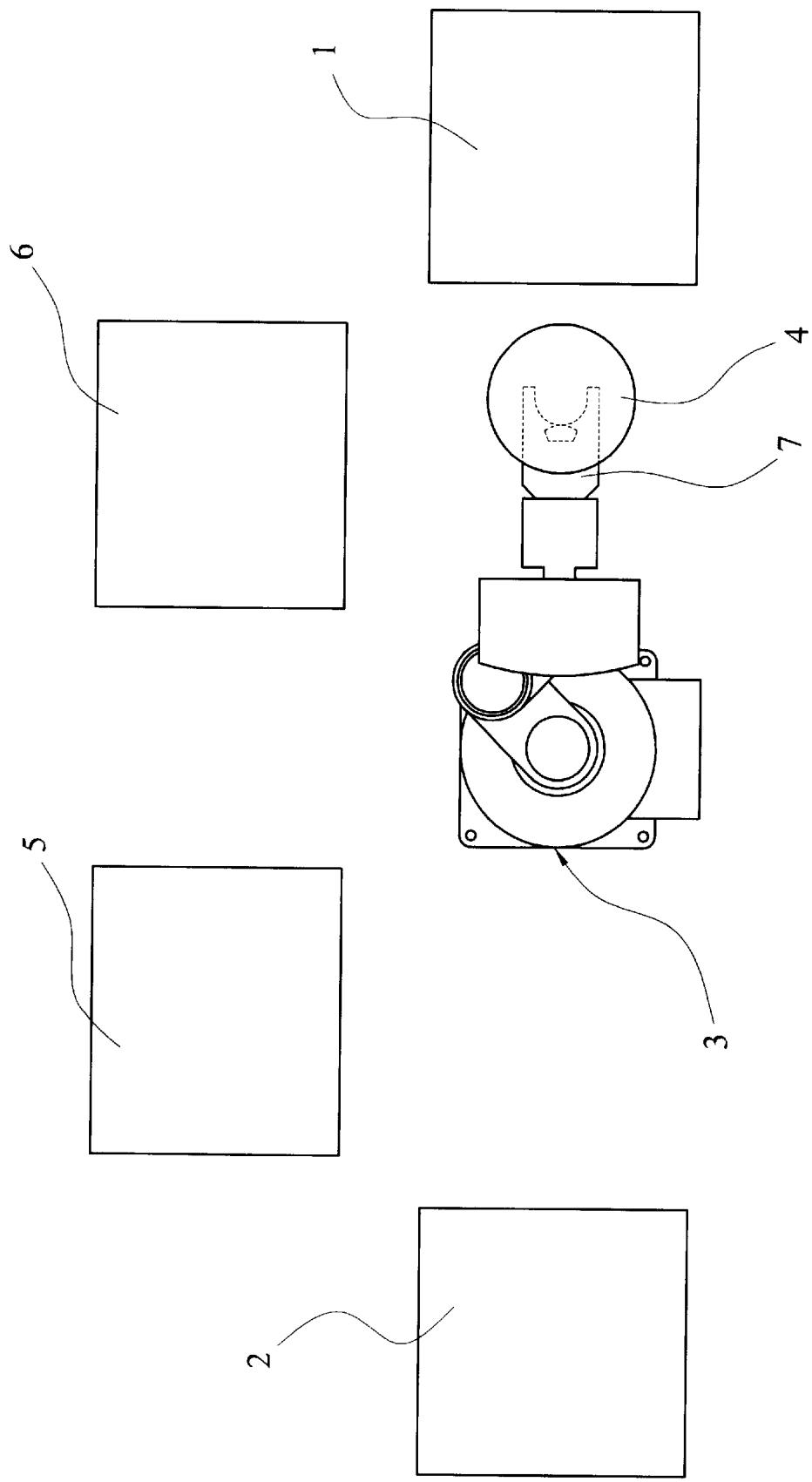
FIG. 2 is a schematic view of the semiconductor tape-peeling apparatus.
Figure 3:
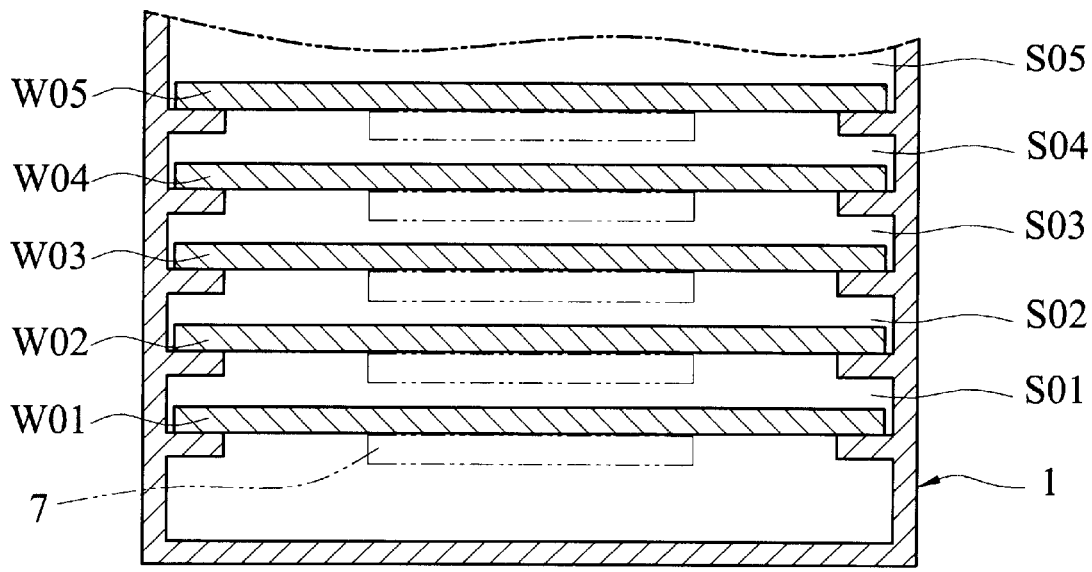
FIG. 3 is an ideally partial sectional illustration showing the first cassette for storing 25 wafers in the semiconductor tape-peeling apparatus as shown in FIG. 2.
Figure 4:
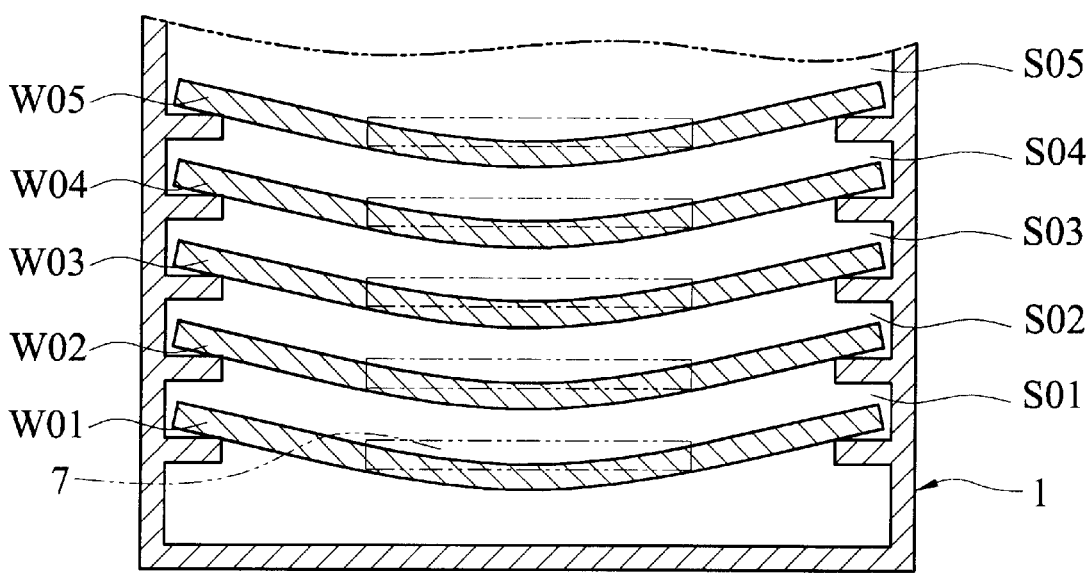
FIG. 4 is a practically partial sectional illustration showing the first cassette for storing 25 wafers in FIG. 2.
Figure 5:
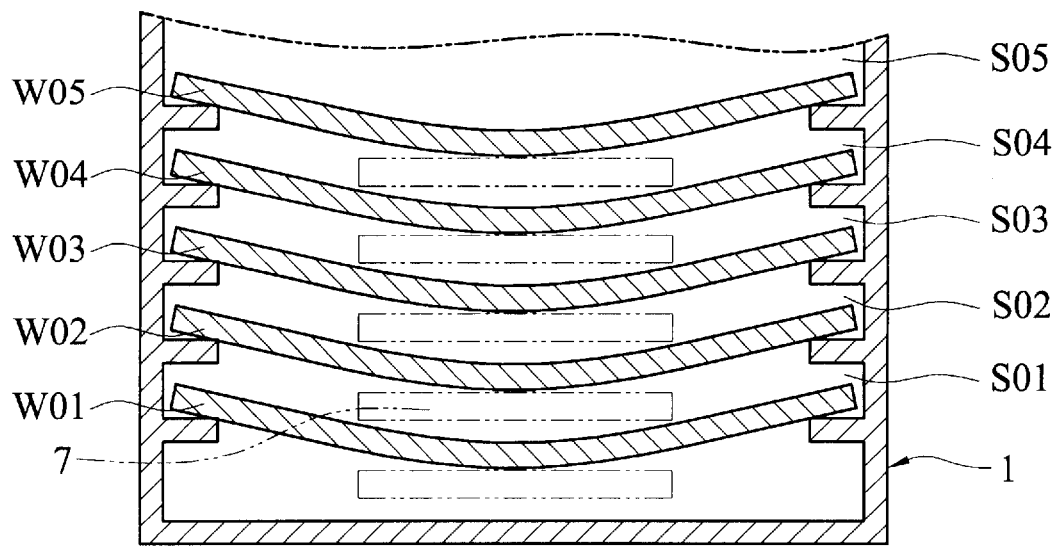
FIG. 5 shows another situation of the first cassette as shown in FIG. 4.
Figure 6:
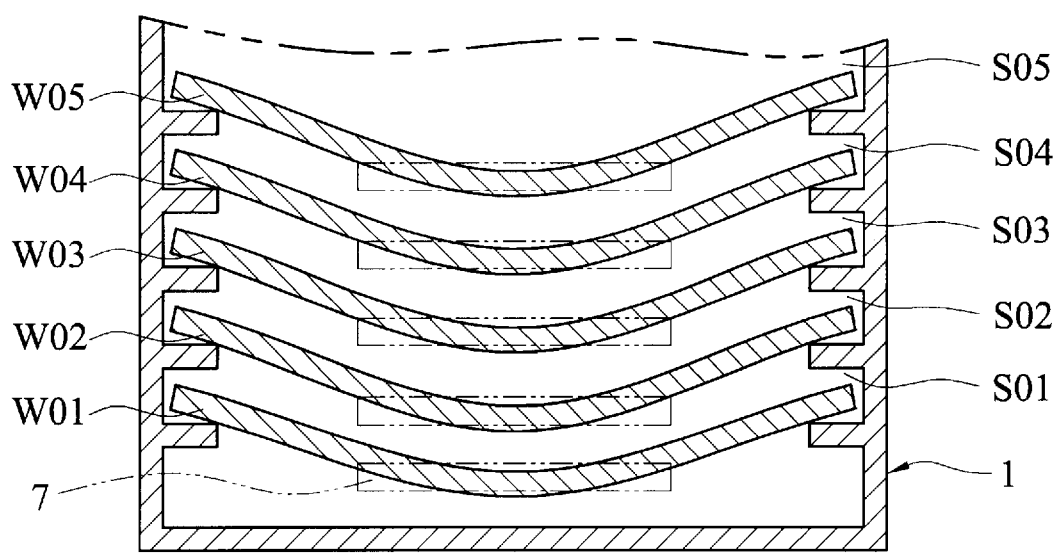
FIG. 6 shows yet another situation of the first cassette as shown in FIG. 4.
Figure 7:
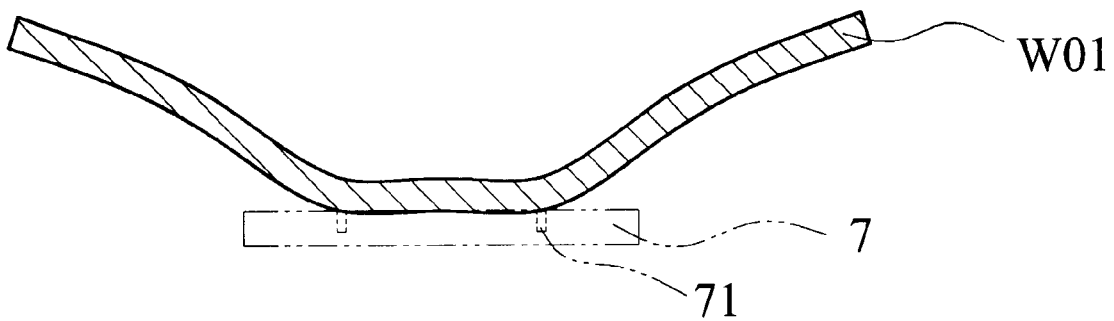
FIG. 7 is an illustration showing the wafer sucked by the suction means in the conventional semiconductor tape-peeling apparatus.

In FIGS. 8 and 9, the first cassette 1, the second cassette 2, the robot arm 3, the wafers W25 to W01, the tape-peeling device 5, the flat positioner 6, the suction means 7, and the wafer storage slots S25 to S01 are similar to those in FIGS. 2 and 3. Therefore, a detail description is omitted.

By comparing FIGS. 8 and 2, it can be known that the embodiment of the invention is characterized in that the front-sides of the wafers are sucked by the suction means 7. This characteristic is described hereinbelow.

Referring to FIG. 9 again, in order to prevent the suction means 7 from crashing any of the wafers W25 to W01, the method for transferring wafers W25 to W01 includes the steps of:

(1) activating the robot arm 3 to the first cassette 1 so that the suction means 7 enters the first cassette 1;

(2) sucking the front-side of the wafer Wi(i=25 to 01) by the suction means 7 (it should be noted that the wafer Wi corresponds to the wafer 4 in FIG. 8 at this moment);

(3) activating the robot arm 3 to unload the wafer Wi from the first cassette 1;

(4) transferring the wafer Wi to the flat positioner 6;

(5) positioning the wafer Wi by the flat positioner 6 so that the flat side or notch of the wafer Wi directs to a predetermined direction;

(6) activating the robot arm 3 to suck the back-side of the wafer Wi by the suction means 7;

(7) transferring the wafer Wi to the tape-peeling device 5;

(8) peeling the tape on the wafer Wi by the tape-peeling device 5;

(9) activating the robot arm 3 to suck the back-side of the wafer Wi by the suction means 7;

(10) transferring the wafer Wi to the second cassette 2;

(11) storing the wafer Wi to the wafer storage slot Si(i=25 to 01) of the second cassette 2; and

(12) repeating steps (1) to (11) for 24 iterations with i=i−1 until the tapes on all the wafers W25 to W01 are peeled and the wafers W25 to W01 are stored in the wafer storage slots S25 to S01, respectively.

By comparing the wafer transfer methods of the invention and the prior art, it can be known that the difference between the methods lies in step (2). By making a start-up from the uppermost wafer to the lowermost wafer, and by sucking the front-side of the wafer and transferring the wafer to the flat positioner 6, the undesired effect that the suction means 7 crashes the wafer can be entirely avoided. Furthermore, the positioning processes of the robot arm 3 only need to be done once so that the positioning points of the robot arm need not to be adjusted frequently.

Figure 10:
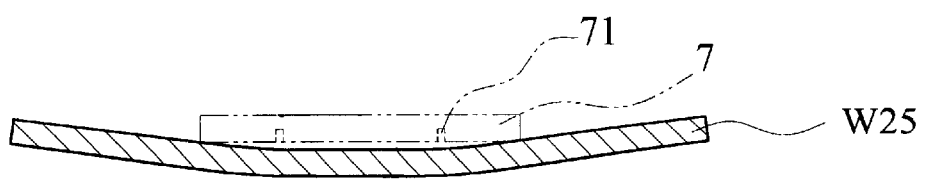
FIG. 10 is an illustration showing the wafer sucked by the suction means in the semiconductor tape-peeling apparatus in accordance with the preferred embodiment of the invention.

Referring to FIG. 10, the suction means 7 also includes a plurality of vacuuming conduits 71. By making use of the vacuuming conduits 71, the wafer W25 can be sucked and unloaded, and the deformation of the wafer W25 can be reduced. Therefore, the excessive deformation and destruction can be avoided.

When sucking the wafer by the suction means 7 of the vacuum type, the suction means 7 must be reversible so as to selectively suck the front-side or the back-side of the wafer in the above steps (1) to (12). The reversibility is easily achieved in the conventional robot arm. Therefore, the present invention can be easily carried out.

While the invention has been described by way of example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A wafer transfer method in a semiconductor tape-peeling apparatus, said semiconductor tape-peeling apparatus comprising: a first cassette for storing a plurality of wafers, each of said plurality of wafers having a front-side to which a tape is adhered and a back-side; and a robot arm including a suction means for sucking and transferring said plurality of wafers, said wafer transfer method comprising the step of:

sucking the front side of the uppermost one of said plurality of wafers stored in said first cassette and unloading said uppermost wafer.

2. The wafer transfer method according to claim 1, wherein said semiconductor tape-peeling apparatus further comprises a flat positioner, a tape-peeling device, and a second cassette, said wafer transfer method further comprising the steps of:

transferring said wafer to said flat positioner;
    positioning said wafer by said flat positioner;
    sucking said back-side of said wafer by said robot arm;
    transferring said wafer to said tape-peeling device;
    peeling the tape on said wafer by said tape-peeling device;
    sucking said back-side of said wafer; and
    transferring said wafer to said second cassette.

* * * * *